(12) United States Patent
Haga et al.

(10) Patent No.: US 6,784,680 B2
(45) Date of Patent: Aug. 31, 2004

(54) CONTACT PROBE WITH GUIDE UNIT AND FABRICATION METHOD THEREOF

(75) Inventors: Tsuyoshi Haga, Hyogo (JP); Katsuya Okumura, Tokyo (JP); Nobuo Hayasaka, Yokosuka (JP); Hideki Shibata, Yokohama (JP); Noriaki Matsunaga, Chigasaki (JP)

(73) Assignees: Sumitomo Electric Industries, Ltd., Osaka (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/445,181

(22) Filed: May 23, 2003

(65) Prior Publication Data
US 2003/0210063 A1 Nov. 13, 2003

Related U.S. Application Data

(62) Division of application No. 09/870,420, filed on May 30, 2001, now abandoned.

(30) Foreign Application Priority Data

Jun. 1, 2000 (JP) ........................................ 2000-164407

(51) Int. Cl.$^7$ .......................... G01R 31/02; H01R 13/24
(52) U.S. Cl. ...................................... 324/761; 439/700
(58) Field of Search ................................. 324/754, 761; 439/219, 700

(56) References Cited

U.S. PATENT DOCUMENTS

| | | | |
|---|---|---|---|
| 4,773,877 A | 9/1988 | Krueger et al. | |
| 5,015,947 A | 5/1991 | Chism | |
| 5,513,430 A | 5/1996 | Yanof et al. | |
| 5,576,630 A | 11/1996 | Fujita | |
| 5,667,410 A | 9/1997 | Johnston | |
| 5,977,783 A | 11/1999 | Takayama et al. | |
| 5,989,994 A | 11/1999 | Khoury et al. | |
| 6,358,097 B1 | * 3/2002 | Peters | ........................ 439/700 |

FOREIGN PATENT DOCUMENTS

| | | |
|---|---|---|
| CH | 676885 | 3/1991 |
| DE | G8711110 | 2/1988 |
| JP | 622964 | 3/1994 |
| JP | 622965 | 3/1994 |
| JP | 07-027789 | 1/1995 |
| JP | 09-034286 | 2/1997 |
| JP | 09-279365 | 10/1997 |
| JP | 10 303258 | 11/1998 |
| JP | 11-044708 | 2/1999 |
| JP | 11-160355 | 6/1999 |
| JP | 11-191453 | 7/1999 |
| JP | 11-269587 | 10/1999 |
| JP | 11-337575 | 12/1999 |
| JP | 2000-162241 | 6/2000 |
| JP | 2001-13166 | 1/2001 |
| JP | 2001-342591 | 12/2001 |

OTHER PUBLICATIONS

U.S. patent application No. 09/604,463; pp. 1 to 44; 6 sheets of drawings.
U.S. patent application Publication No. US 2002/0127812 A1; Cover Sheet, 7 sheets of drawings and pp. 1 to 6; published Sep. 12, 2002.

* cited by examiner

Primary Examiner—Evan Pert
Assistant Examiner—Russell M Kobert
(74) Attorney, Agent, or Firm—W. F. Fasse; W. G. Fasse

(57) ABSTRACT

A contact probe is fabricated by a method including a lithography step and a plating step. The contact probe includes a plunger unit to form contact with a circuit to be tested, a spring unit, and a lead wire connection unit, all formed integrally so as to have a three dimensional configuration with uniform thickness with respect to a predetermined plane configuration in a thickness direction perpendicular to the predetermined plane configuration. Preferably, a guide unit parallel to the spring unit is also formed integrally. Further preferably, the contact probe is formed integrally also including a stopper for each unitary configuration of the spring unit constituted by a leaf spring.

15 Claims, 14 Drawing Sheets

(a)

(b)

CONTACT PROBE WITH GUIDE UNIT AND FABRICATION METHOD THEREOF

CROSS-REFERENCE TO RELATED APPLICATION

This application is a Divisional of U.S. application Ser. No. 09/870,420, filed May 30, 2001 now abandoned.

BACKGROUND OF THE INVENTION

1. Field of the Invention

The present invention relates to a contact probe to electrically test semiconductor substrates, liquid crystal displays and the like, and a method of fabricating such a contact probe.

2. Description of the Background Art

Testing of circuitry formed on semiconductor substrates, liquid crystal displays and the like is generally performed using a testing device with a plurality of contact probes. The conventional structure of each of such contact probes is as described in, for example, Japanese Utility Model Laying-Open Nos. 6-22964 and 6-22965. A structure thereof is shown in FIG. 18. Referring to FIG. 18, a contact probe 100 has a barrel 103 placed in a socket 104. A spring 102 employing a coil spring is arranged in barrel 103. A plunger 101 to make contact with a circuit that is to be tested is urged by spring 102 in a direction protruding from the end of barrel 103.

According to this structure, plunger 101, spring 102, barrel 103 and socket 104 are individual components. In assembly thereof, plunger 101 and spring 102 are inserted into barrel 103 so that spring 102 urges plunger 101 outwards, followed by inserting this barrel 103 into socket 104.

In accordance with the higher density and microminiaturization of the circuitry that is the subject of testing, more contact probes are now being mounted at higher density per one testing device. As a result, a plurality of contact probes must be arranged at small pitches of not more than 0.1 mm.

The conventional contact probe 100 as described with reference to FIG. 18 had to be assembled from individual components such as plunger 101, spring 102, barrel 103 and socket 104. Therefore, in accordance with the fine geometry of the contact probe, the assembly process has become more difficult since respective components are correspondingly reduced in size. Since each component is conventionally fabricated by machining, the size of each component is also reduced in accordance with the microminiaturization of contact probes. The machining process of each component has become more difficult. Particularly when components formed by machining are to be arranged at the pitch of not more than 0.1 mm, the thickness of each component will become the bottleneck in the arrangement.

In the case where many contact probes are to be mounted in one testing device, the cost for component machine work will become higher in proportion to the increase of the number of contact probes since each contact probe component was conventionally formed by machining. The demand in the field of art could not be satisfied sufficiently.

In accordance with the increase in speed of the circuit operation and reduction in the pitch, crosstalk noise between contact probes has become noticeable. Such noise will degrade the detection sensitivity.

SUMMARY OF THE INVENTION

In view of the foregoing, an object of the present invention is to provide an ultra fine contact probe to correspond to reduction in the pitch, and a method of fabricating such a contact probe.

Another object of the present invention is to provide a contact probe that has the shielding function to prevent crosstalk noise even when of an ultra fine structure.

According to an aspect of the present invention, a contact probe includes a plunger unit to form contact with a circuit to be tested, a spring unit supporting the plunger unit at one end, and a lead wire connection unit electrically connecting the other end of the spring unit with a lead wire. The plunger unit, the spring unit and the lead wire connection unit are formed integrally. This structure eliminates the need to form each component and assembly thereof. Reduction in the size of the contact probe and increase in the number of contact probes can be accommodated more easily.

In the invention of the present aspect, the plunger unit, the spring unit and the lead wire connection unit are formed integrally so as to have a three dimensional configuration with uniform thickness with respect to a predetermined plane configuration in a thickness direction perpendicular to the predetermined plane configuration.

By employing the above-described structure, a contact probe, even of an ultra fine structure, can easily be fabricated as an integral object according to a fabrication method of a combination of lithography and plating using a predetermined mask.

In the invention of the present aspect, the contact probe preferably includes a guide unit arranged parallel to the spring unit to maintain the spring unit at a constant posture. The plunger unit, spring unit, lead wire connection unit and guide unit are formed integrally. By this structure, the step of assembling the guide unit can be eliminated even if a guide unit is required depending upon the usage status of the contact probe.

In the invention of the present aspect, the plunger unit, spring unit, lead wire connection unit and guide unit are preferably formed integrally so as to form a three dimensional configuration with uniform thickness with respect to a predetermined plane configuration in a thickness direction perpendicular to said predetermined plane configuration.

By the above structure, a contact probe including a guide unit, even of an ultra fine structure, can be easily fabricated as an integral object according to a fabrication method of a combination of lithography and plating using a predetermined mask.

In the invention of the present aspect, the contact probe preferably includes a cylindrical member including a conductor having the inner wall covered with an insulator. The cylindrical member surrounds the outer side of the spring unit. The plunger unit protrudes from the cylindrical member. This structure allows the cylindrical member to function as a guide unit. Since the cylindrical member includes a conductor, the spring unit is shielded by the cylindrical member to prevent crosstalk noise.

In the invention of the present aspect, the lead wire connection unit and the cylindrical member are fixed with respect to each other. By this structure, displacement of the cylindrical member during usage can be prevented.

Preferably, the spring unit has a configuration in which a leaf spring of a unitary configuration is repeated several times and connected. By this structure, a mask of only a simple pattern is required. A spring unit having a uniform spring constant at all sites can be provided.

Preferably, the spring unit includes a stopper for each of said unitary configuration. The stopper is arranged so as to abut against the leaf spring of the above-described unitary configuration to prevent further elastic deformation when the elastic deformation in the longitudinal direction of the spring unit exceeds a predetermined value. This structure prevents the spring from exceeding the elasticity limit to achieve plastic deformation and become disabled.

Preferably, the plunger unit includes a top portion and inclination portions sandwiching the top portion. The inclination portions are angled at not more than 90° with respect to each other. The radius of curvature of the transverse section of the top portion is not more than 5 μm. By this structure, the insulating film such as a natural oxide film formed at the surface of the circuit to be tested can easily be broken through to ensure electrical contact.

Preferably, a portion or all of the surface of the plunger unit including the top portion is covered with a material of low volume resistivity that is lower than the volume resistivity of the material inside the plunger unit. By this structure, the electrical contact resistance when the plunger unit is brought into contact with the circuit to be tested can be reduced to ensure stable electrical contact.

According to another aspect of the present invention, a method of fabricating a contact probe is provided. The contact probe includes a plunger unit to form contact with a circuit to be tested, a spring unit supporting the plunger unit at one end, and a lead wire connection unit electrically connecting the other end of the spring unit with the lead wire. The plunger unit, the spring unit and the lead wire connection unit are formed integrally so as to have a three dimensional configuration with uniform thickness with respect to a predetermined plane configuration in a thickness direction perpendicular to the predetermined plane configuration. The contact probe fabrication method includes a resist formation step of coating a resist on a substrate having conductivity, an exposure step of exposing the resist using an integral mask, a first resist removal step of removing the portion of the resist exposed at the exposure step, a forming step of filling the portion of the resist removed at the first resist removal step with metal, a second resist removal method of removing the remaining portion of the resist, and a substrate removal step of removing the substrate. As the integral mask, a mask of a configuration having the contact probe projected in the thickness direction is employed.

By the above-described fabrication method, a contact probe having the plunger unit, spring unit and lead wire connection unit formed integrally can be easily fabricated. Reduction in the size and complexity of the contact probe can be accommodated. Furthermore, the assembly process is unnecessary.

Preferably, the contact probe further includes a guide unit arranged parallel to the spring unit to maintain the spring unit at a constant posture.

By the fabrication method, a contact probe having the plunger unit, spring unit, lead wire connection unit and guide unit formed integrally can be easily fabricated. Also, reduction in the size and complexity of the contact probe can be accommodated. Furthermore, the assembly process is unnecessary.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
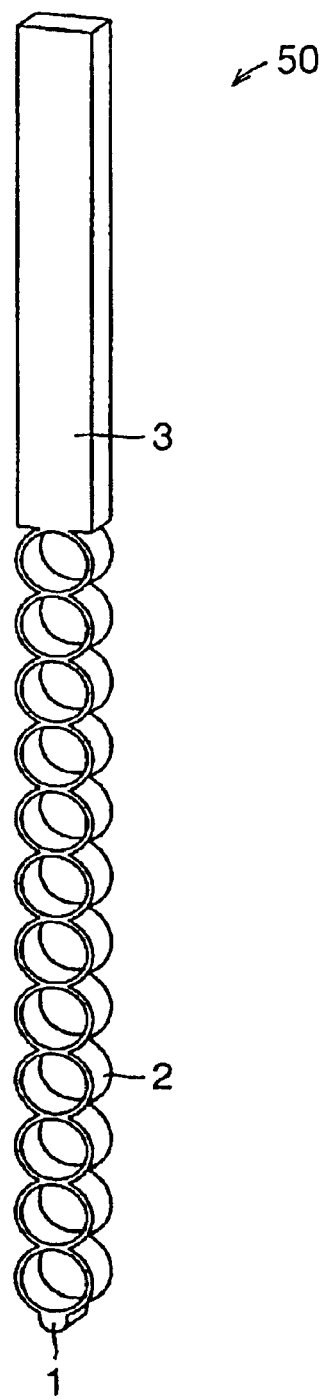
FIG. 1 is a perspective view of a contact probe according to a first embodiment of the present invention.

Referring to FIG. 1, a structure of a contact probe 50 according to a first embodiment of the present invention will be described hereinafter. Contact probe 50 includes a plunger unit 1 to form contact with a circuit to be tested, a spring unit 2, and a lead wire connection unit 3. Spring unit 2 supports plunger unit 1 at one end. The other end of spring unit 2 is connected to lead wire connection unit 3. Lead line connection unit 3 functions to electrically connect the end of spring unit 2 with a lead wire (not shown).

This structure is formed integrally from a conductive material. As shown in FIG. 1, a three dimensional configuration is established with uniform thickness with respect to a predetermined plane configuration in a thickness direction perpendicular to the predetermined plane configuration. Therefore, the thickness is substantially identical at all portions. The thickness direction is the direction from the left bottom side towards the right upper side in FIG. 1.

In the exemplary contact probe 50 of FIG. 1, spring unit 2 has a configuration in which a leaf spring constituting a ring as a unitary configuration is repeatedly formed. The plurality of the rings are connected.

A method of fabricating contact probe 50 will be described hereinafter with reference to FIGS. 2–7.

A resist 22 is formed (not shown) at the surface of a conductive substrate 21. An Si substrate sputtered with Ti is used as substrate 21. Other conductive substrates such as an aluminum substrate may be employed alternatively.

Figure 2:
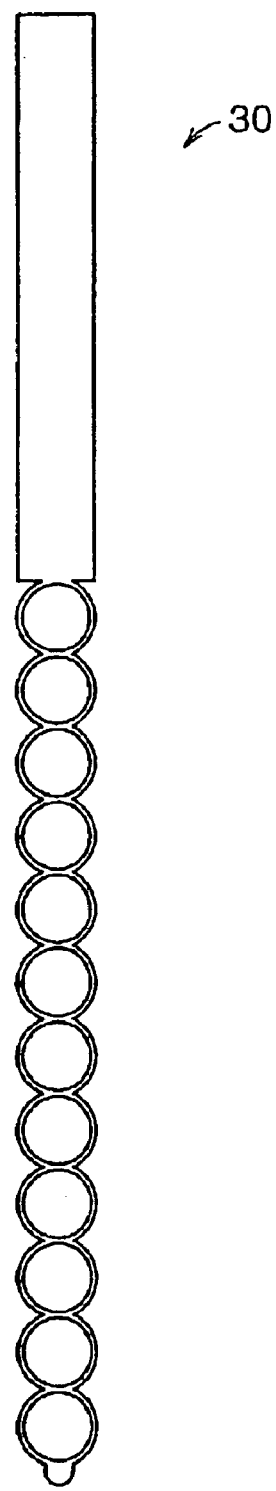
FIG. 2 is a plan view of an integral mask employed in the fabrication method of a contact probe according to the first embodiment of the present invention.
Figure 3:
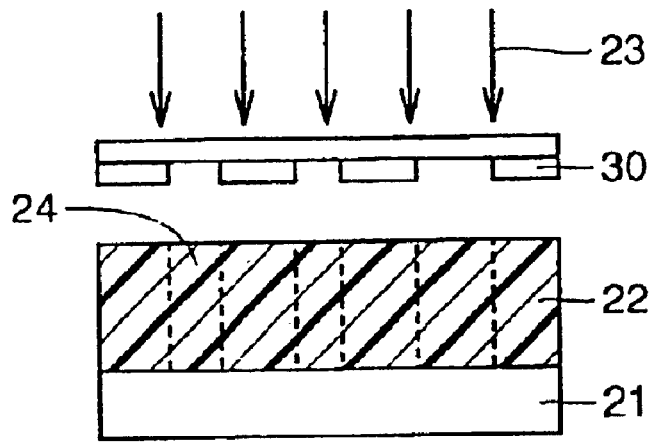
FIGS. 3, 4, 5, 6 and 7 are sectional views of the contact probe of the first embodiment in a first step, second step, third step, fourth step, and fifth step, respectively, in the fabrication method of the contact probe.

Using an integral mask 30 shown in FIG. 2, the surface of resist 22 is irradiated with an X-ray 23 as shown in FIG. 3.

Figure 4:
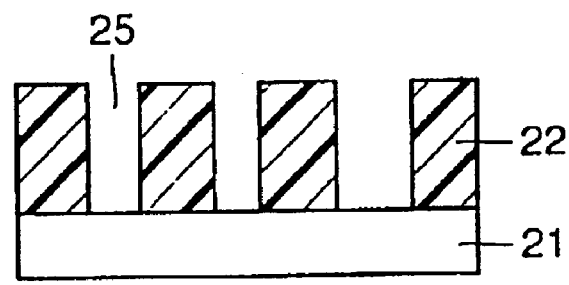

Although a method employing X ray lithography will be described here, UV (Ultra Violet) lithography may be employed instead of X ray lithography. Whichever type of lithography is employed, the resist of exposed portion 24 is removed after development. As a result, a recessed portion 25 as shown in FIG. 4 is formed.

Figure 5:
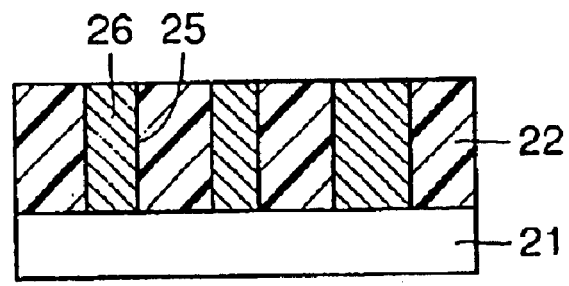

Referring to FIG. 5, forming is applied to fill recessed portion 25 with a metal layer 26. Possible material for metal layer 26 includes nickel, or nickel based alloy such as Ni—Co, Ni—W, and Ni—Mn. Also, palladium (Pd), rhodium (Rh) or ruthenium (Ru) may be employed.

Figure 6:
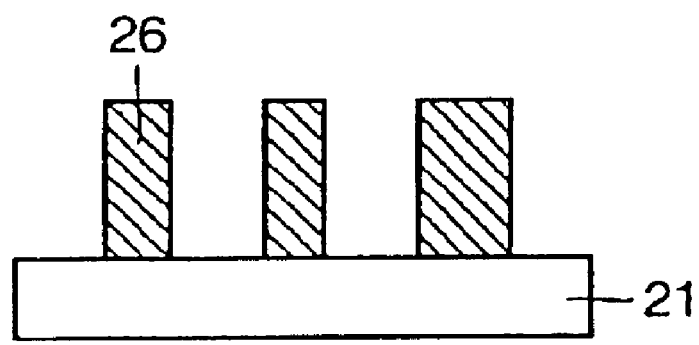
Figure 7:
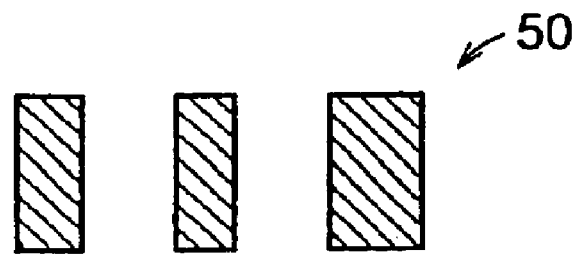

Resist 22 remaining on substrate 21 is removed by ashing using oxygen plasma or by a development process after radiation. As a result, the structure shown in FIG. 6 is obtained. Using potassium hydroxide (KOH), the region of substrate 21 is dissolved away to leave only the portion of metal layer 26. As a result, contact probe 50 is produced as shown in FIG. 7. In other words, this corresponds to contact probe 50 of FIG. 1.

In order to reduce the electrical contact resistance of plunger unit 1, the entire surface or the surface around the leading end of plunger unit 1 can be plated with gold (Au) or rhodium (Rh).

Figure 8:
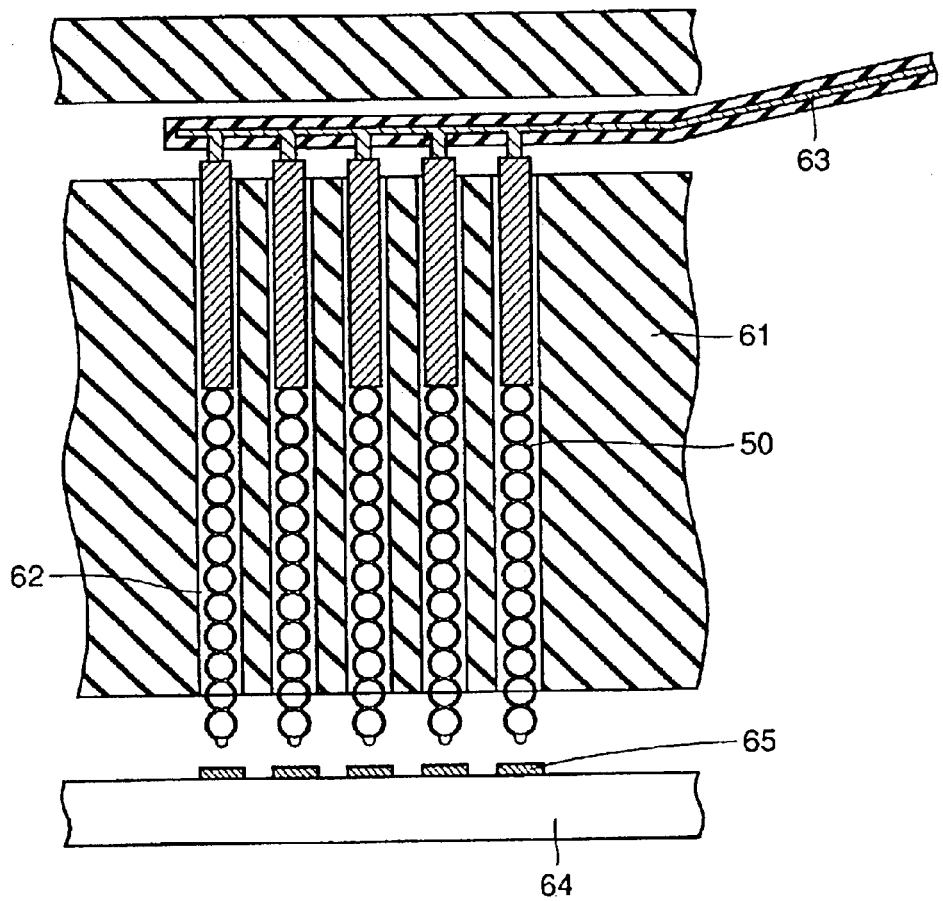
FIG. 8 is a diagram to describe the usage status of the contact probe of the first embodiment.

A specific method of testing a circuit to be tested 65 formed at the surface of an under-test substrate 64 using contact probe 50 will be described with reference to FIG. 8. A plurality of guide holes 62 corresponding to the arrangement pitch of under-test circuit 65 are provided at an insulating substrate 61 of the testing device. A contact probe 50 is arranged in each of guide holes 62. The leading end of each contact probe 50 protrudes outwards from the side of insulating substrate 61 facing under-test substrate 64. At the other side of insulating substrate 61 opposite to under-test substrate 64, a lead wire such as a flexible printed circuit (FPC) 63 is arranged so as to be electrically connected to lead wire connection unit 3 of each contact probe. Under-test circuit 65 is tested using such a testing device.

Since the above contact probe has a three dimensional configuration with uniform thickness with respect to a predetermined plane configuration in a thickness direction perpendicular to said predetermined plane configuration as described with reference to FIG. 1, a contact probe, even of an ultra fine structure, can be easily fabricated as an integral object according to a fabrication method of a combination of lithography and plating. Since each component does not have to be machined or assembled in the fabrication method, reduction in the size and complexity of the contact probe can be accommodated sufficiently.

In contact probe 50, plunger unit 1 is supported at one end of spring unit 2. Since spring unit 2 is formed of a combination of leaf springs of unitary configuration, any force or impact applied towards plunger unit 1 in the longitudinal direction of contact probe 50 (vertical direction in FIG. 1) will cause spring unit 2 to be deformed elastically as a whole to absorb that applied energy. Therefore, as in a conventional contact probe, the stroke of elastic deformation can be ensured sufficiently while the width of the entire contact probe can be reduced compared to the conventional case. For example, the width can be set to less than 0.1 mm with a stroke of at least 0.05 mm.

Even though the configuration is ultra fine, variation in the spring constant can be set low enough. For example, assuming that the range of the spring constant is 0.1 N/mm–10 N/mm, variation in the spring constant is within ±35% in the case of UV lithography and within ±10% in the case of X ray lithography. Variation according to X ray lithography is smaller since the resolution in lithography is superior due to the shorter wavelength for X rays, which allows a leaf spring to be produced more precise in thickness.

By covering the entire surface of the plunger or the surface around the leading end of the plunger unit with a material such as gold (Au) or rhodium (Rh) of a volume resistivity lower than that of the material inside the plunger, the electrical contact resistance when the plunger unit is brought into contact with the under-test circuit can be reduced. Therefore, stable electrical contact can be ensured.

Figures 9A, 9B, 9C:
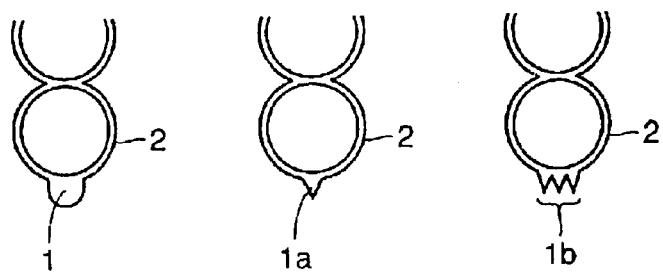
FIGS. 9A–9C are enlarged plan views of the plunger unit of the contact probe of the first embodiment.

The configuration of the contact probe is not limited to that shown in FIG. 1. An enlargement of the periphery of plunger unit 1 of contact probe 50 of FIG. 1 is shown in FIG. 9A. A plunger unit 1a as shown in FIG. 9B or a plunger unit 1b as shown in FIG. 9C may be employed depending upon the configuration and property of the circuit to be tested.

Figure 10A:
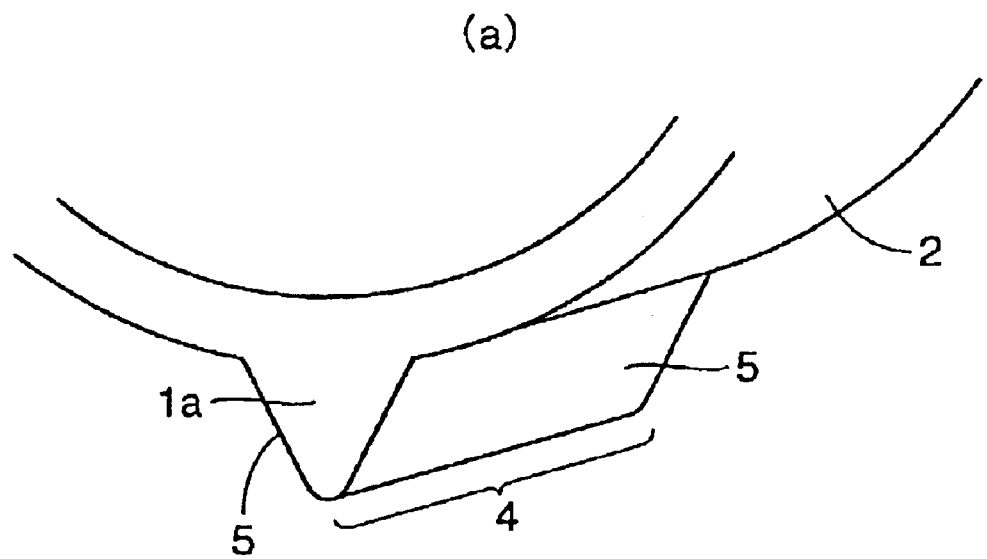
FIG. 10A is an enlarged perspective view and FIG. 10B is a transverse sectional view, respectively, of the plunger unit of the contact probe of the first embodiment.
Figure 10B:
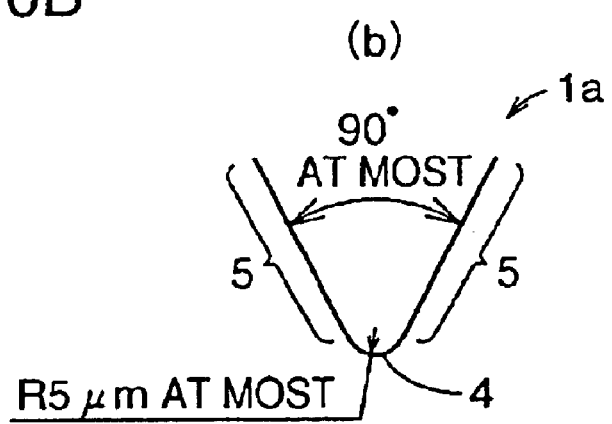

An enlarged perspective view of plunger unit 1a of FIG. 9B is shown in FIG. 10A. Plunger unit 1a has a constant thickness. More specifically, plunger unit 1a includes a top portion 4 as one side and inclination portions 5 that are two planes sandwiching top portion 4. The transverse sectional view of the configuration of plunger unit 1a is as shown in FIG. 10B. More specifically, inclination portions 5 are angled not more than 90° with respect to each other. The radius of curvature of the transverse plane of top portion 4 is preferably not more than 5 μm. This provides the advantage that an insulating film such as a natural oxide film formed at the surface of the under-test circuitry can be easily broken to ensure electrical contact.

Figure 11:
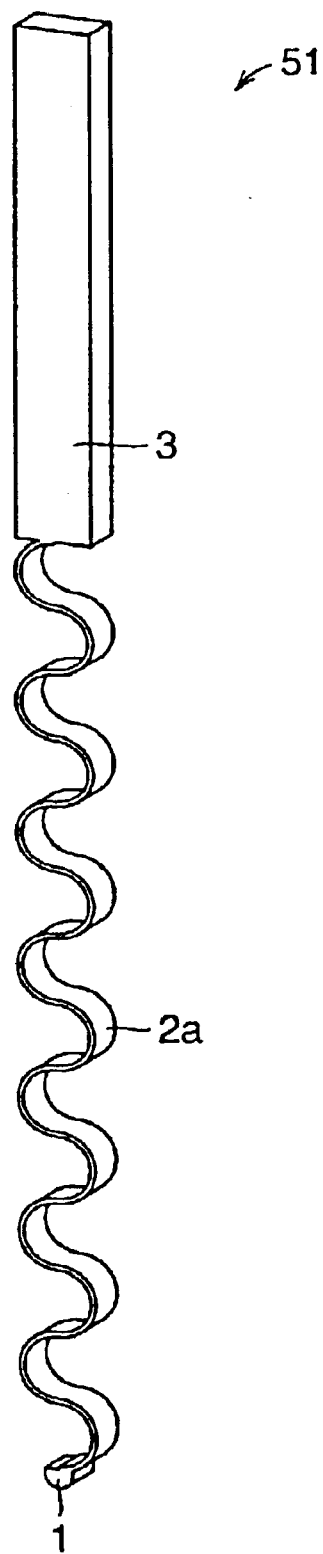
FIG. 11 is a perspective view of another contact probe according to the first embodiment of the present invention.

Although a leaf spring of unitary configuration that is repeated for a plurality of times continuously as shown in FIG. 1 is desirable for the spring unit, a configuration other than that shown in FIG. 1 can be employed. For example, a contact probe 51 as shown in FIG. 11 may be provided, having a wave-like spring unit 2a. In the case of spring unit 2a, the S shaped portion formed of the leaf spring can be regarded as the unitary configuration.

Second Embodiment

A structure of a contact probe 52 according to a second embodiment of the present invention will be described with reference to FIG. 12. Contact probe 52 includes a plunger unit 1 to form contact with a circuit to be tested, a spring unit 2, a lead wire connection unit 3, and a guide unit 6. The structural elements other than the addition of guide unit 6 are similar to those of the first embodiment shown in FIG. 1. Guide unit 6 is formed integrally with the other components.

Figure 13:
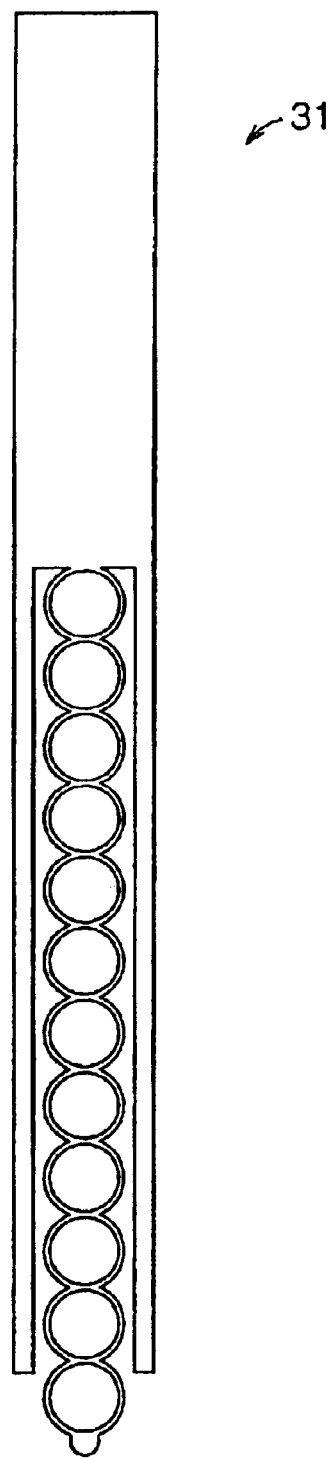
FIG. 13 is a plan view of an integral mask employed in the fabrication method of a contact probe of the second embodiment.

In comparison to the fabrication method described in the first embodiment, an integral mask 31 shown in FIG. 13 is used instead of integral mask 30 of FIG. 2. The remaining steps are similar to those of the first embodiment.

The embodiment described with reference to FIG. 8 has contact probe 50 arranged in guide hole 62 of insulating substrate 61. Therefore, a guide unit 6 was not required. However, in other usages, some guide is required to prevent buckling of spring unit 2 and to maintain spring unit 2 at a constant posture. In the case of contact probe 50 shown in FIG. 1, a guide unit had to be attached afterwards. In the case of contact probe 52 shown in FIG. 12, no attaching process is required since guide unit 6 is formed integrally. Therefore, the labor in assembling can be alleviated. Furthermore, guide unit 6 can be provided at the desired relationship of position as long as integral mask 31 is properly designed.

Figure 12:
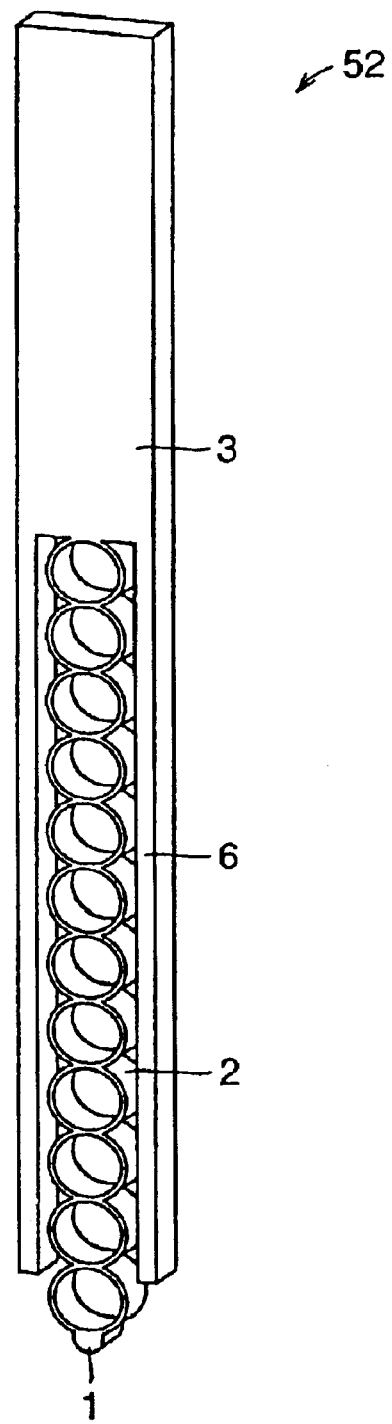
FIG. 12 is a perspective view of a contact probe according to a second embodiment of the present invention.
Figure 14:
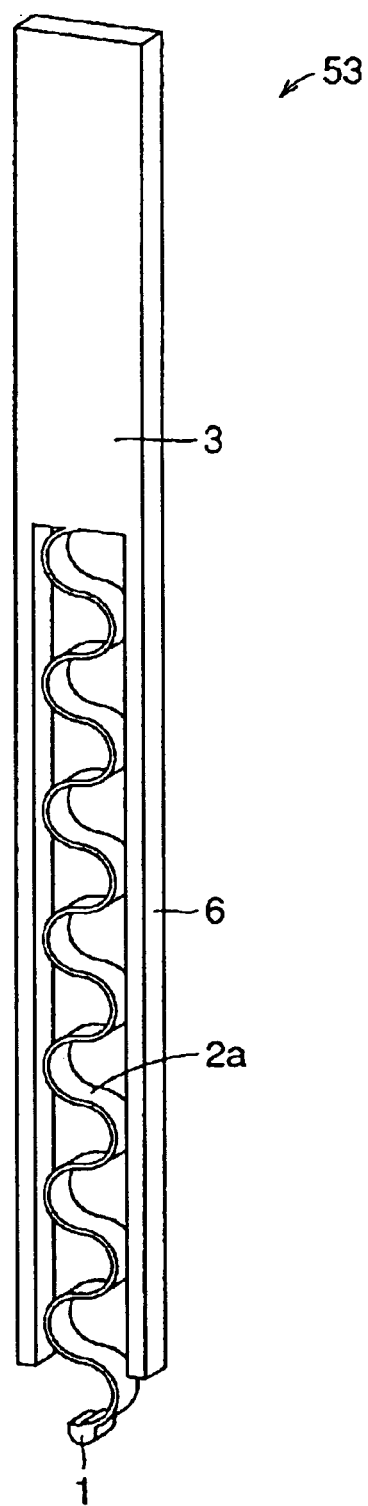
FIG. 14 is a perspective view of another contact probe of the second embodiment.

In the case guide unit 6 is provided, the configuration of the spring unit is not limited to that of spring unit 2 in contact probe 52 shown in FIG. 12. For example, contact probe 53 as shown in FIG. 14 may have a spring unit 2a.

Figure 15:
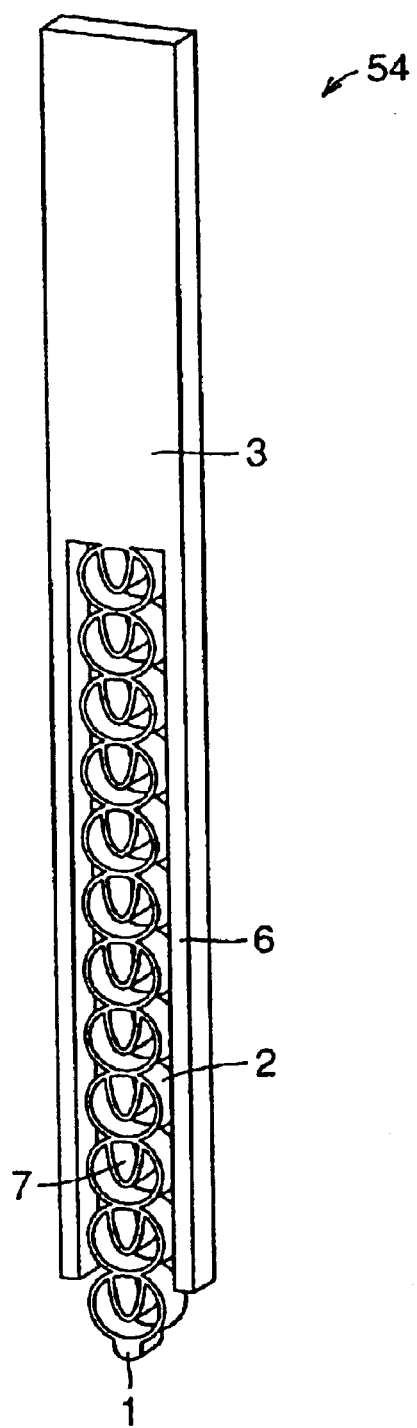
FIG. 15 is a perspective view of a further contact probe of the second embodiment.

Also, a structure may be implemented in which a stopper 7 is provided for each unitary configuration of spring unit 2 for contact probe 52 to result in a contact probe 54 as shown in FIG. 15. Stopper unit 7 is a member to prevent the spring from sagging excessively. This structure prevents the spring from exceeding the elasticity limit to achieve plastic deformation and become disabled.

Figure 16:
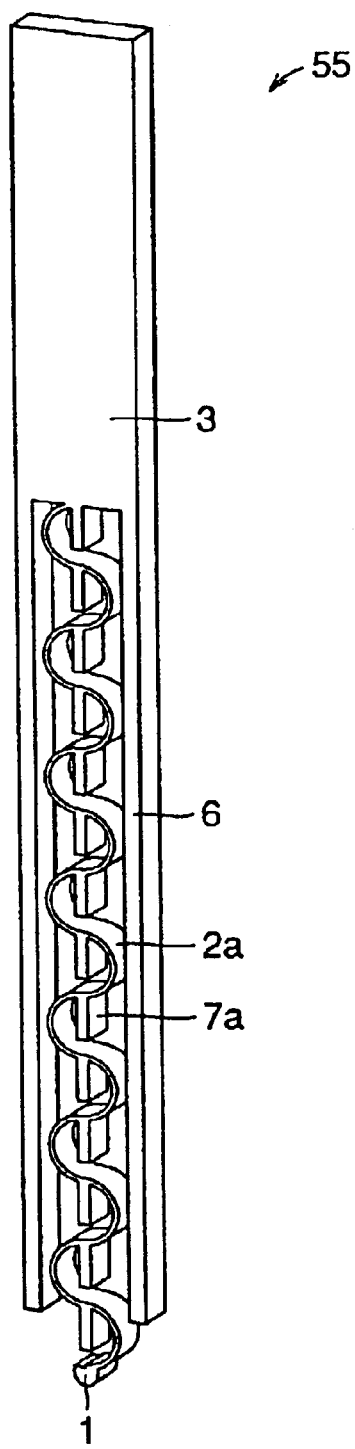
FIG. 16 is a perspective view of still another contact probe of the second embodiment.

The configuration of the stopper is not limited to that of stopper 7. For example, a stopper 7a as shown in FIG. 16 of a contact probe 55 can be provided. Any change in the configuration of the stopper can be accommodated by just modifying the pattern configuration of the integral mask. A contact probe can be formed integrally according to a fabrication method employing lithography and plating as described in the first embodiment.

Third Embodiment

Figure 17A:
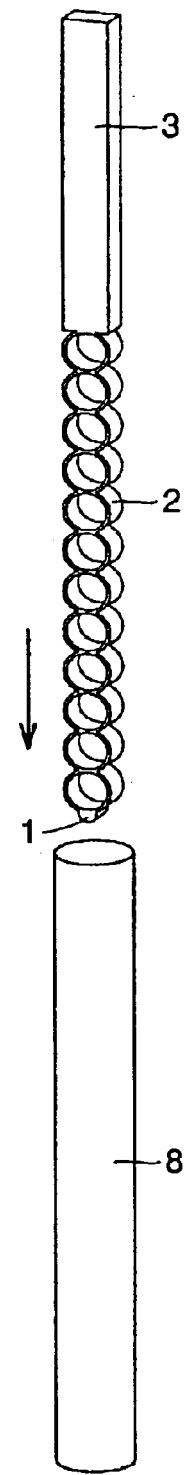
FIG. 17A is a diagram to describe the assembly of the contact probe of a third embodiment.
Figure 17B:
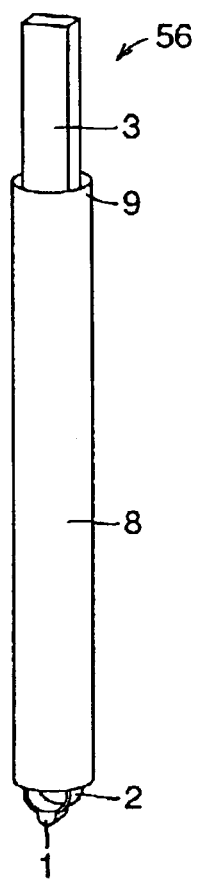
FIG. 17B is a perspective view of a completed product thereof.
Figure 18:
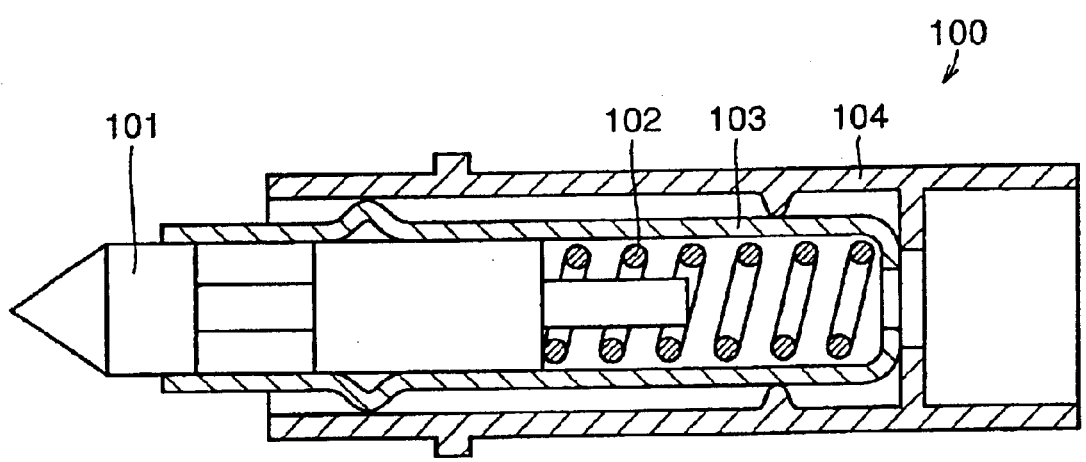
FIG. 18 is a sectional view of a contact probe according to conventional art.

A contact probe 56 according to a third embodiment of the present invention is similar to contact probe 50 of FIG. 1 in the configuration of the integrally formed portion. However, as shown in FIG. 17A, the integrally formed portion is inserted inside a cylindrical member 8, and plunger unit 1 protrudes from the other end of cylindrical member 8, as shown in FIG. 17B. Cylindrical member 8 is basically formed of a conductor having the inner wall covered with an insulator. Furthermore, at a fixed portion 9 where lead wire connection unit 3 and cylindrical member 8 overlap, lead wire connection unit 3 and cylindrical portion 8 are preferably fixed to each other.

Since plunger unit 1 protrudes from an end of cylindrical member 8, plunger unit 1 can be brought into contact with the circuit to be tested as in the conventional case. Furthermore, since spring unit 2 is accommodated in cylindrical member 8, an additional guide unit does not have to be provided to maintain the posture of spring unit 2. Cylindrical member 8 plays the role of the guide unit. Also, since cylindrical member 8 is basically formed of a conductor, it also serves to shield spring unit 2. Although cylindrical member 8 is formed of a conductor, contact with spring unit 2 will not cause the current flowing through spring unit 2 to short circuit since the inner wall is covered with an insulator. Furthermore, the advantageous effects described hereinafter are also obtained.

A specific example of the present embodiment will be described. In the fabrication method of the first embodiment, a contact probe 50 having a width of 0.056 mm was fabricated. A bronze or stainless steel pipe having an outer diameter of 1.2 mm and an inner diameter of 0.08 mm with the inner side coated with an insulator such as Teflon (registered) or parylene was prepared as cylindrical member 8. Alternatively, cylindrical member 8 may be a glass pipe or a resin pipe of Teflon, Duracon (registered) and the like instead of the above-described pipe, and may have the outer side coated with metal. Furthermore, cylindrical member 8 is not limited in its cylindrical configuration, and may have a cross section other than a circle.

As shown in FIGS. 17A and 17B, contact probe 50 is inserted in cylindrical member 8 and attached adhesively or caulked at fixed portion 9.

Then, an electrode (not shown) is pulled out from each of lead wire connection unit 3 and cylindrical member 8. By connecting cylindrical member 8 to ground, spring unit 2 is shielded by cylindrical member 8. Therefore, measurement at a high frequency of approximately several GHz that generally causes crosstalk noise is allowed.

In establishing contact with the circuit to be tested, contact probe 56 is pushed forward until not only plunger unit 1 but also cylindrical member 8 forms contact with the same circuit to be tested, and different potentials having a potential difference of at least a predetermined level are applied across plunger unit 1 and cylindrical member 8. Since contact probe 56 is pushed forward, the contact of plunger unit 1 and cylindrical member 8 with the circuit can be ensured. By applying a potential difference of at least a predetermined level, electrical breakdown occurs at the oxide film at the surface of the circuit to result in current flow. Accordingly, the oxide film at the surface of the circuit can be broken to obtain favorable electrical conductance.

Since a contact probe can be fabricated as an integral object according to the method employing lithography and plating, the machining process for each component is unnecessary, and assembly is no longer required. Therefore, reduction in the size and increase of the number of contact probes can be accommodated more easily. The provision of a cylindrical member allows the spring portion to be shielded to prevent crosstalk noise.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A contact probe comprising:

a plunger unit adapted to make contact with a circuit to be tested, a spring unit supporting said plunger unit at one end of said spring unit, a lead wire connection unit electrically connecting another end of said spring unit with a lead wire, and a guide unit extending parallel to and adjacently along said spring unit in a final operative configuration of said contact probe such that said guide unit maintains said spring unit at a constant alignment parallel to said guide unit, wherein said plunger unit, said spring unit, said lead wire connection unit, and said guide unit are formed integrally as an integral one-piece component, with said plunger unit, said spring unit, said lead wire connection unit and said guide unit all lying flatly on and extending flatly along a single common plane of said integral one-piece component in said final operative configuration.

2. The contact probe according to claim 1, wherein said plunger unit, said spring unit, said lead wire connection unit, and said guide unit are formed integrally so as to have a three dimensional flat shape with a uniform thickness in a thickness direction perpendicular to said single common plane in said final operative configuration.

3. A method of fabricating the contact probe according to claim 2, said method of fabricating the contact probe comprising:

a resist formation step of coating a resist on a conductive substrate, an exposure step of exposing said resist using an integral mask, a first resist removal step of removing a first portion of said resist that is exposed by said exposure step, a forming step of filling with metal an area at which said first portion of said resist was removed in said first resist removal step, a second resist removal step of removing a remaining portion of said resist, and a substrate removal step of removing said substrate, wherein said integral mask employs a mask having a mask configuration from which said three-dimensional flap shape of said contact probe is projected in said thickness direction.

4. The contact probe according to claim 1, wherein said spring unit comprises a repetitive configuration including a plurality of a unitary configuration of a leaf spring that is repeated several times and connected.

5. The contact probe according to claim 4, wherein each said unitary configuration of said leaf spring comprises an annular circular leaf spring portion.

6. The contact probe according to claim 4, wherein said spring unit further comprises a respective stopper for each said unitary configuration, said stopper being arranged to abut against said unitary configuration of said leaf spring so as to limit an elastic deformation of said spring unit in a longitudinal direction not to exceed a predetermined value.

7. The contact probe according to claim 4, wherein each said unitary configuration of said leaf spring comprises a sinusoidally undulating leaf spring portion including a single sinusoidal undulation cycle.

8. The contact probe according to claim 1, wherein said plunger unit includes a tip portion and sloping side portions with said tip portion therebetween, wherein said sloping side portions are angled at not more than 90° with respect to each other, and a radius of curvature of a transverse section of said tip portion is not more than 5 µm.

9. The contact probe according to claim 1, wherein said plunger unit includes a tip portion, and wherein at least a part of a surface of said plunger unit including said tip portion is covered with a coating material having a volume resistivity lower than a volume resistivity of a core material inside said plunger unit.

10. The contact probe according to claim 1, wherein said spring unit comprises a leaf spring including a plurality of annular circular leaf spring portions connected integrally to one another in series.

11. The contact probe according to claim 10, wherein said spring unit further comprises a respective stopper for each said leaf spring portion, said stopper being arranged to abut against said leaf spring portion of said leaf spring so as to limit an elastic deformation of said spring unit in a longitudinal direction not to exceed a predetermined value.

12. The contact probe according to claim 10, wherein said plunger unit, said spring unit, said lead wire connection unit, and said guide unit are formed integrally so as to have a three dimensional flat shape with a uniform thickness in a thickness direction perpendicular to said single common plane in said final operative configuration.

13. The contact probe according to claim 1, wherein said plunger unit includes plural adjacent tapering tip portions respectively spaced apart from one another between pairs of eloping side portions on said single common plane in said final operative configuration, wherein said tapering tip portions are adapted to make contact with the circuit to be tested along said single common plane in said final operative configuration.

14. The contact probe according to claim 13, wherein said sloping side portions of each said pair are respectively angled at not more than 90° relative to each other, and each said tapering tip portion has a sectional radius of curvature not more than 5 µm.

15. A contact probe comprising:

a plunger unit adapted to make contact with a circuit to be tested, a spring unit supporting said plunger unit at one end of said spring unit, a lead wire connection unit electrically connecting another end of said spring unit with a lead wire, and a guide unit arranged parallel to said spring unit to maintain said spring unit at a constant alignment parallel to said guide unit, wherein said plunger unit, said spring unit, said lead wire connection unit, and said guide unit are formed integrally as an integral one-piece component;

wherein said spring unit comprises a repetitive configuration including a plurality of a unitary configuration of a leaf spring that is repeated several times and connected; and wherein each said unitary configuration of said leaf spring comprises a sinusoidally undulating leaf spring portion including a single sinusoidal undulation cycle.

* * * * *